(12) United States Patent
Choi et al.

(10) Patent No.: US 11,538,702 B2
(45) Date of Patent: Dec. 27, 2022

(54) APPARATUS FOR MONITORING AN EXCHANGING PROCESS OF A SEMICONDUCTOR PART AND A METHOD FOR THE SAME

(71) Applicant: Adaptive Plasma Technology Corp., Icheon-si (KR)

(72) Inventors: Woo Hyung Choi, Seongnam-si (KR); Sang Woo Lee, Suwon-si (KR)

(73) Assignee: ADAPTIVE PLASMA TECHNOLOGY CORP., Icheon-si (KR)

( * ) Notice: Subject to any disclaimer, the term of this patent is extended or adjusted under 35 U.S.C. 154(b) by 56 days.

(21) Appl. No.: 17/140,294

(22) Filed: Jan. 4, 2021

(65) Prior Publication Data

US 2022/0216082 A1  Jul. 7, 2022

(51) Int. Cl.
| | | |
|---|---|---|
| *G06T 7/00* | (2017.01) | |
| *H01L 21/67* | (2006.01) | |
| *H01L 21/687* | (2006.01) | |
| *G06T 7/73* | (2017.01) | |
| *B25J 19/00* | (2006.01) | |
| *B25J 19/02* | (2006.01) | |
| *B25J 11/00* | (2006.01) | |
| *H04N 7/18* | (2006.01) | |

(52) U.S. Cl.
CPC ..... *H01L 21/67288* (2013.01); *B25J 11/0095* (2013.01); *B25J 19/0025* (2013.01); *B25J 19/023* (2013.01); *G06T 7/0004* (2013.01); *G06T 7/73* (2017.01); *H01L 21/68721* (2013.01); *H04N 7/18* (2013.01); *G06T 2207/30148* (2013.01)

(58) Field of Classification Search
CPC ....... G06T 7/80; A45C 11/04; G02B 27/0172; G02B 2027/014; G02B 2027/0178; H02J 7/0044; H04W 4/30
See application file for complete search history.

(56) References Cited

U.S. PATENT DOCUMENTS

| | | | | |
|---|---|---|---|---|
| 5,597,995 | A * | 1/1997 | Williams | G16H 20/13 235/375 |
| 6,011,876 | A * | 1/2000 | Kishner | H04N 5/217 348/E5.079 |
| 9,482,882 | B1 * | 11/2016 | Hanover | H01R 13/6205 |
| 9,952,452 | B1 * | 4/2018 | Hanover | H01R 13/6205 |
| 10,993,515 | B1 * | 5/2021 | Kim | A45C 15/00 |
| 2009/0154764 | A1 * | 6/2009 | Khan | B65B 3/003 348/61 |
| 2017/0185738 | A1 * | 6/2017 | Moharir | G16H 80/00 |
| 2017/0237908 | A1 * | 8/2017 | Ko | H04N 5/2252 386/341 |
| 2018/0090958 | A1 * | 3/2018 | Steger | H02J 7/342 |

(Continued)

FOREIGN PATENT DOCUMENTS

| | | |
|---|---|---|
| KR | 20110056841 | 5/2011 |
| KR | 20170054248 | 5/2017 |

*Primary Examiner* — Frank F Huang
(74) *Attorney, Agent, or Firm* — Cantor Colburn LLP

(57) ABSTRACT

Provided is an apparatus for monitoring an exchanging process of a semiconductor part and a method for the same. The apparatus comprises finger having a structure capable of loading the part and transferred by a robot for exchanging; and at least one image obtaining means coupled to the finger and obtaining an image of an exchanging position.

5 Claims, 5 Drawing Sheets

(56) References Cited

U.S. PATENT DOCUMENTS

| | | | | |
|---|---|---|---|---|
| 2018/0131847 A1* | 5/2018 | Kokonaski | ............ | H04N 5/2252 |
| 2019/0272800 A1* | 9/2019 | Tao | ......................... | G09G 5/006 |
| 2019/0325601 A1* | 10/2019 | Chen | ................. | H01L 21/67259 |
| 2019/0387958 A1* | 12/2019 | Kimpe | ................ | A61B 1/00057 |
| 2020/0013657 A1* | 1/2020 | Lee | ..................... | H01L 21/6833 |
| 2020/0179787 A1* | 6/2020 | Swan | ................... | A63B 33/004 |
| 2020/0251929 A1* | 8/2020 | Partovi | ................. | H02J 50/005 |

\* cited by examiner

APPARATUS FOR MONITORING AN EXCHANGING PROCESS OF A SEMICONDUCTOR PART AND A METHOD FOR THE SAME

BACKGROUND OF THE INVENTION

Field of the Invention

The present invention relates to an apparatus for monitoring an exchanging process of a semiconductor part and a method for the same, in particular, the apparatus and the method for detecting a fixing position to avoid a processing error generated from an arranging error in course of or after exchanging semiconductor parts.

Description of the Related Art

A consumable article such as an edge ring used in a semiconductor manufacturing field should be replaced periodically. The edge ring may have a function to restrict a plasma or gas flow at a wafer edge for enhancing a process uniformity or reliability. For replacing the edge ring, an inner volume of a chamber should be in an atmospheric pressure condition for removing a lid. But, if the replacement of the edge ring is performed in a vacuum condition by a robot, then a time for replacement and back-up of a facility may be reduced to improve productivity. Korean patent publication No. 10-2017-0054248 discloses a cluster tool assembly for removing a consumable part and replacing the part in a processor module installed at the cluster tool assembly. And also, Korean patent publication No. 10-2011-0056841 discloses a load lock chamber including an aligning apparatus for a wafer. It is advantageous in a manufacturing efficiency that a certain change of a semiconductor processing facility is minimized and the time for exchanging decreases during replacing the article. And the means for avoiding alignment errors which may be brought about during replacing the article is needed, thereby satisfying a desired degree of precision for semiconductor processing. However, the prior arts do not disclose a technique with the advantages.

Purpose of the Invention

The object of the present invention is to provide with an apparatus for monitoring an exchanging process of a semiconductor part and a method for the same, wherein a fixing position of the part in course of or after exchanging is detected for verifying the part is fixed at a predetermined position and the fixing position may be corrected for avoiding a processing error due to an exchanging error.

SUMMARY OF THE INVENTION

In an embodiment of the present invention, an apparatus for monitoring an exchanging process of a semiconductor part comprises a finger having a structure capable of loading the part and transferred by a robot for exchanging; and at least one image obtaining means coupled to the finger and obtaining an image of an exchanging position.

In other embodiment of the present invention, the finger comprises a pair of hands where the image obtaining means are secured respectively.

In another embodiment of the present invention, an image obtained by the image obtaining means is processed as a wireless transmittable data for transmitting in a wireless communication.

In still another embodiment of the present invention, the part is an edge ring coupled around a wafer, and the image obtaining means obtains an image for detecting a separation distance between an electrostatic chuck and the edge.

In still another embodiment of the present invention, a method for monitoring an exchanging process of a semiconductor part comprises fixing the part transferred by a robot arm at an exchanging position; preparing a part exchanging means having a camera module to transmit an obtained image via a wireless communication; moving the part exchanging means to the exchanging position; obtaining at least one image of different portions of the fixed part, and transmitting the image via a wireless communication; extracting at least one parameter value from the image, and judging whether the value is within a reference range; and storing the parameter value, wherein the camera module obtains the image through a hole formed at the part exchanging means.

In still another embodiment of the present invention, the camera module obtains a state information of a processing chamber.

In still another embodiment of the present invention, a power for the camera module is supplied through the robot arm.

DETAILED DESCRIPTION OF EXEMPLARY EMBODIMENTS

Exemplary embodiments of the present invention will be described herein below with reference to the accompanying drawings.

Figure 1:
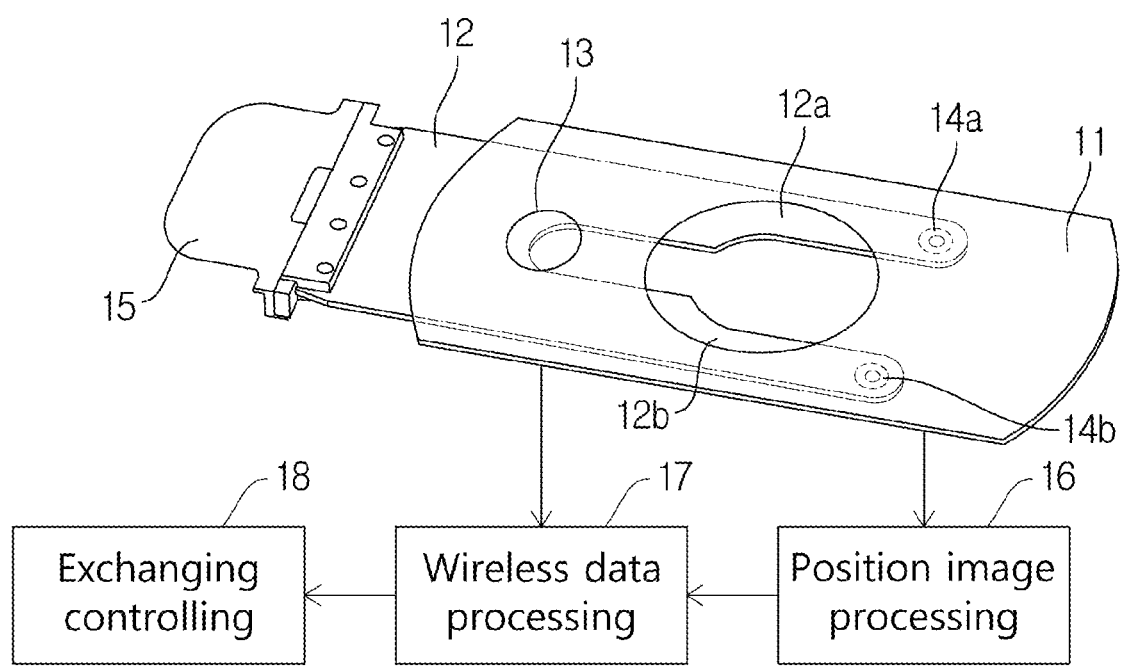
FIG. 1 shows an exemplary embodiment of an apparatus for monitoring an exchanging process of a semiconductor part according to the present invention.

FIG. 1 shows an exemplary embodiment of an apparatus for monitoring an exchanging process of a semiconductor part according to the present invention. Referring to FIG. 1, an apparatus for monitoring an exchanging process of a semiconductor part comprises a finger 12 having a structure capable of loading the part and transferred by a robot for exchanging; and at least one image obtaining means 14a, 14b coupled to the finger and obtaining an image of an exchanging position.

The part may be an edge ring for securing a wafer at a predetermined location in a course of semiconductor process, but not limited to, and the apparatus can monitor an exchanging process of any consumable parts or any parts to be exchanged owing to wearing out. The consumable parts have to be exchanged because of their use-by date, defects or the like, the exchanging part may be a new one for substituting the exchanged part. The apparatus for monitoring may be moved into a processing chamber by an automatic transferring apparatus such as a robot arm. As shown in FIG. 1, the apparatus may comprise the finger 12 coupled to a transferring means 15, and the part may be loaded on a loading unit 11. The loading unit 11 may be loaded on the finger 12 to be fixed, or the loading unit 11 may be an integral part of the finger 12. For example, the finger 12 may have a structure or means for securing detachably the loading unit 11 in a predetermined location such as a groove, a protrusion, a magnetic coupling means or the like. The part may be loaded on the loading unit 11, and the finger 12 may transfer the loading unit 11 into an electrostatic chuck displaced with a vacuum chamber. The finger 12 may comprise a pair of hands 12*a*, 12*b* extending in parallel, and the loading unit 11 may have a shape of a rectangular plane, a circular plane or the like. The loading unit 11 may be located on the pair of hands 12*a*, 12*b*, and the finger 12 may be transferred by a robot arm such as a vacuum robot. The image obtaining means 14*a*, 14*b* may be coupled to an end of each finger hand 12*a*, 12*b* or at a predetermined portion of each finger hand 12*a*, 12*b*. The pair of finger hands 12*a*, 12 extending in a parallel way may have a similar or an identical structure each other, and the image obtaining means 14*a*, 14*b* may be secured detachably to each finger hand 12*a*, 12*b*. A focus of each image obtaining means 14*a*, 14*b* may be formed vertically to the plane formed by the finger 12. The finger 12 may be coupled to the robot arm by a coupler 15, and the loading unit 11 may be moved to various places according to an operation of the robot arm. For example, the loading unit 11 may be transferred to the electrostatic chuck ESC displaced within a processing chamber. A processor 13 may be included in the loading unit 11, the finger 12 or the coupler 15, and the processor 13 may be an electric chip comprising a micro processing unit. The processor 13 may check a condition of the loading unit 11, or may control any operation of various electronic elements mounted on the loading unit 11. The processor 13 may control an operation of each image obtaining means 14*a*, 14*b*, and the processor 13 may comprise an image processing means for converting an obtained image into an image data that can be transmitted via the wireless communication. And also, the processor 13 may comprise a near field communicating means, and can communicate with an outer operating apparatus via the near field communication. For example, the processor 13 can detect a transferring state of the part, an exchanging state of the part or an exchanging position to transmit it to the outer operating apparatus through the wireless communication. For example, a location information obtained by each image obtaining means 14*a*, 14*b* may be processed by the processor 13 to be transmitted to the outer operating apparatus via the communication. For example, the image obtaining means 14*a*, 14*b* such as a camera may be displaced at the front of the finger 12. The image obtaining means 14*a*, 14*b* may be coupled to the finger hands 12*a*, 12*b* in order to obtain an image of a predetermined position with the part loaded on the loading unit 11, or in order to obtain an image for measuring a relative distance between an exchanging part and the electrostatic chuck. When the image for measuring the relative distance between the exchanging and the electrostatic chuck is obtained, the image data may be converted into a digital electric data by a position image processing unit 16 installed at the image obtaining means 14*a*, 14*b* to be transmitted to the processor 13. The electric data may be converted into a wireless transmittable data by a wireless data processing unit 17 to be transmitted to an exchanging controlling unit 18 displaced at an outside of the vacuum chamber through the robot arm or the near field communication. The location data of the part may be analyzed by the exchanging controlling unit 18 to verify whether the exchanging part is fixed at the predetermined position or not. The image obtaining means 14*a*, 14*b* may be coupled at various portions of the finger 12.

Figure 2:
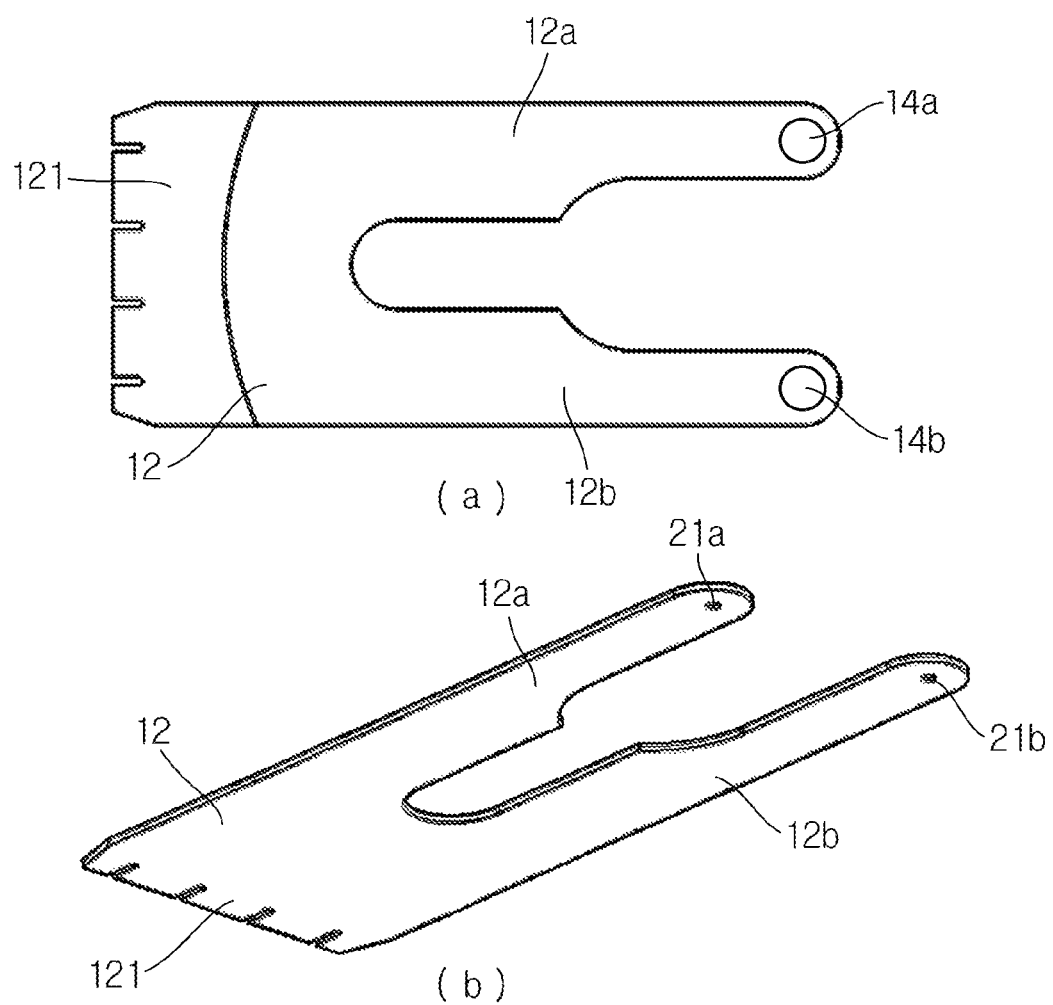
FIG. 2 shows an exemplary embodiment of an arrangement structure for obtaining an image according to the present invention.

FIG. 2 shows an exemplary embodiment of an arrangement structure for obtaining an image according to the present invention.

Referring to FIG. 2, the finger 12 comprises the pair of hands 12*a*, 12*b*, and each image obtaining means 14*a*, 14*b* may be arranged at each hand 12*a*, 12*b*. The finger 12 may have a shape flat in general, and have a connector 121 for connecting a transferring means such as an arm of the vacuum robot. The pair of hands 12*a*, 12*b* may extend side by side respectively from a body extending in a rectangular shape. The pair of hands 12*a*, 12*b* may have various structures to support a lower part of the loading unit 11, but not limited to. A hole may be formed at the body of the finger 12 or the pair of hands 12*a*, 12*b*. For example, a least one penetrating hole 21*a*, 21*b* may be formed at a rear part or a front part of each hand 12*a*, 12*b* along each extending direction. And the image obtaining means 14*a*, 14*b* may be arranged at an end part of each hand 12*a*, 12*b* where the penetrating hole 21*a*, 12*b* is formed. The examples shown in (a) and (b) of FIG. 2 are top and bottom views of the finger 12 according to one embodiment of the invention. In this embodiment, the image obtaining unit 14*a*, 14*b* such as the camera may be installed at an upper part of each hand 12*a*, 12*b* to form a focus in the direction vertical to the finger 12 through the penetrating hole 21*a*, 21*b* for obtaining a top-down image under the hand 12*a*, 12*b*. Alternatively, the image obtaining unit 14*a*, 14*b* may be installed beneath the penetrating hole 21*a*, 21*b* of each hand 12*a*, 12*b*. A power for operating the image obtaining means 14*a*, 14*b* may be supplied through the robot arm, may be supplied from the processor described above, or may be supplied from an independent power source such as a battery, but not limited to. It is verified by the image obtaining means 14*a*, 14*b* installed at the pair of the hands 12*a*, 12*b* whether the semiconductor part such as the edge ring is fixed at an exact position or not.

Figure 3A:
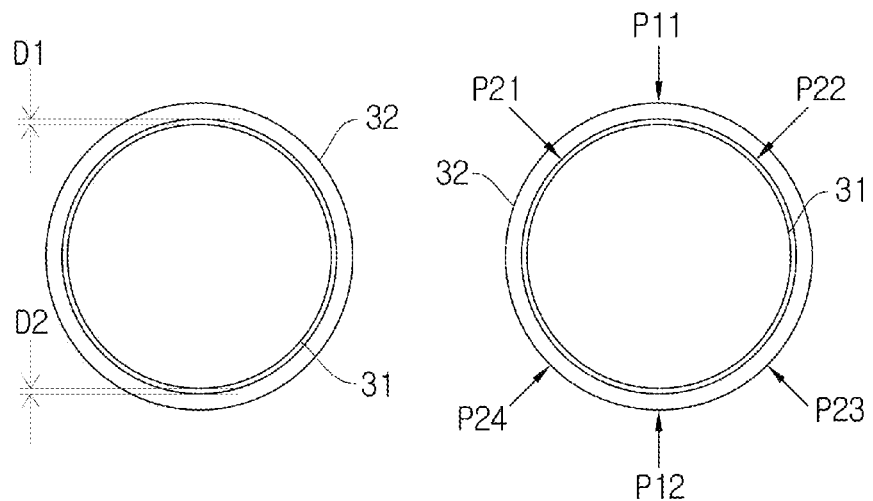
FIGS. 3A and 3B show an exemplary reference position for monitoring an exchange according to the present invention.
Figure 3B:
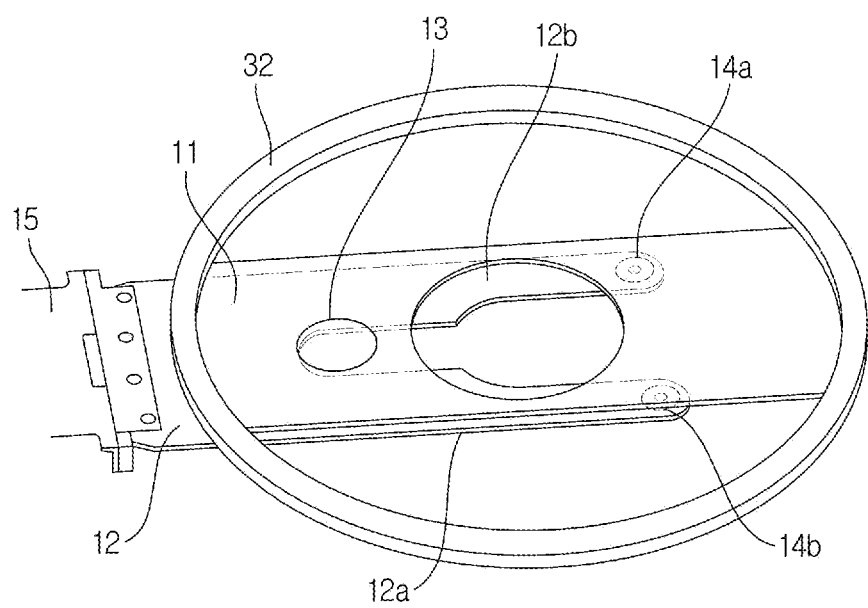

FIGS. 3A and 3B show an exemplary reference position for monitoring an exchange according to the present invention.

Referring to FIG. 3A, the part may be the edge ring 32 coupled to an edge of the wafer, and a separation distance between the electrostatic chuck 31 and the edge ring 32 may be detected by the image obtaining means 14*a*, 14*b* in at least one circumference part of the edge ring 32. The edge ring 32 coupled to the wafer may block a plasma from flowing outside of the wafer. A separation distance between the circumference of the electrostatic chuck 31 and that of the edge ring 31 has to be kept uniformly along the electrostatic chuck circumference for making a plasma density uniform along the wafer circumference, thereby a processing error may be prevented. The edge ring 32 can be delivered within the processing chamber to be fixed at the electrostatic chuck 31 by the finger 12. When the edge ring 32 is fixed around the electrostatic chuck 31, a fixed state of the edge ring 32 may be detected by the image obtaining means 14*a*, 14*b*. As shown in the left part of FIG. 3A, the circular edge ring 32 may be fixed at the circumference of the circular electrostatic chuck 31. Two separation distances D1, D2 at two opposite positions may be calculated using the images obtained by the image obtaining means for verifying whether or not the edge ring 32 is fixed at an exact position. The separation distances D1, D2 may be digitized, and the digitized value may be the exchanging controlling module for verifying whether the digitized value is within a predetermined specification range. The specification range may be different depending on a processing step, and the fixing condition of the edge ring 32 may be verified in each processing step. If the fixed condition of the edge ring 32 is out of the specification range, then an alarm may be generated or an error signal may be generated. As described above, the image obtaining means such as the camera may be installed at each hand, and the image for calculating the separation distance D1, D2 may be obtained by the image obtaining means. The separation distance D1, D2 may be obtained at two or more parts of the electrostatic chuck circumference. For example, two points P11, P12 may be selected as reference points. And also, three points P11, P23, P24 may be selected as reference positions, or four positions P21, P22, P23, P24 may be selected as reference positions. A centering state of the edge ring 32 relative to the electrostatic chuck 31 is determined from various reference positions, but not limited to.

Referring to FIG. 3B, the edge ring 32 may be loaded on the loading unit 11, and the loading unit 11 may be located on the finger 12. The image obtaining means 14a, 14b may be coupled to each end of the hand 12a, 12b. The finger 12 may be coupled to the vacuum robot by the coupler 15, and the edge ring 32 may be fixed at the electrostatic chuck by the operation of the vacuum robot. The finger 12 may be moved again within the processing chamber, after the edge ring 32 has been fixed at the electrostatic chuck. And then the images relative to the reference positions may be obtained by the image obtaining means to be transmitted to the exchanging controlling unit through the processing unit 13 for verifying the fixing state of the edge ring 32. The process for verifying is described below.

Figure 4A:
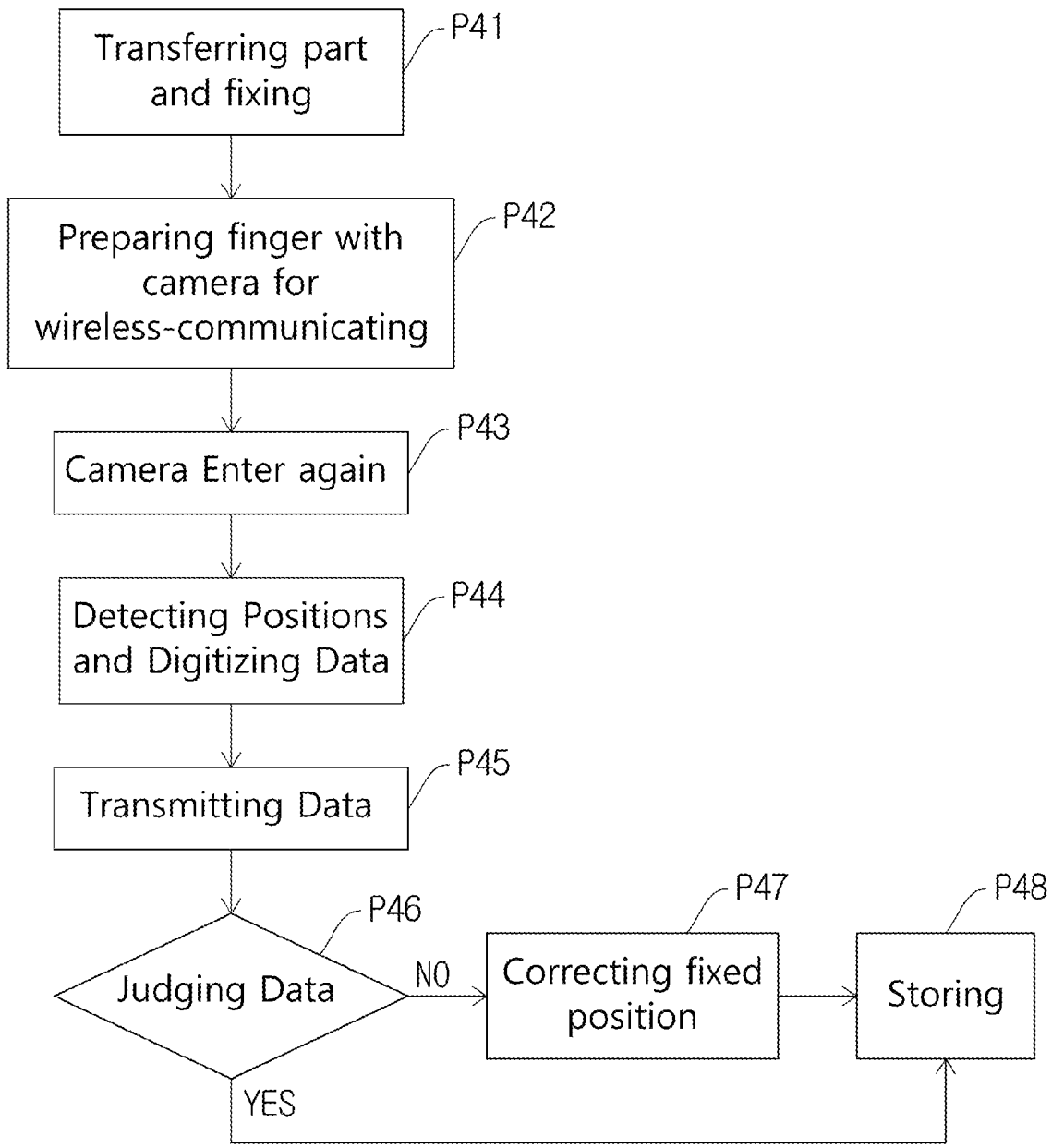
FIGS. 4A and 4B show an exemplary method for monitoring an exchanging process according to the present invention.
Figure 4B:
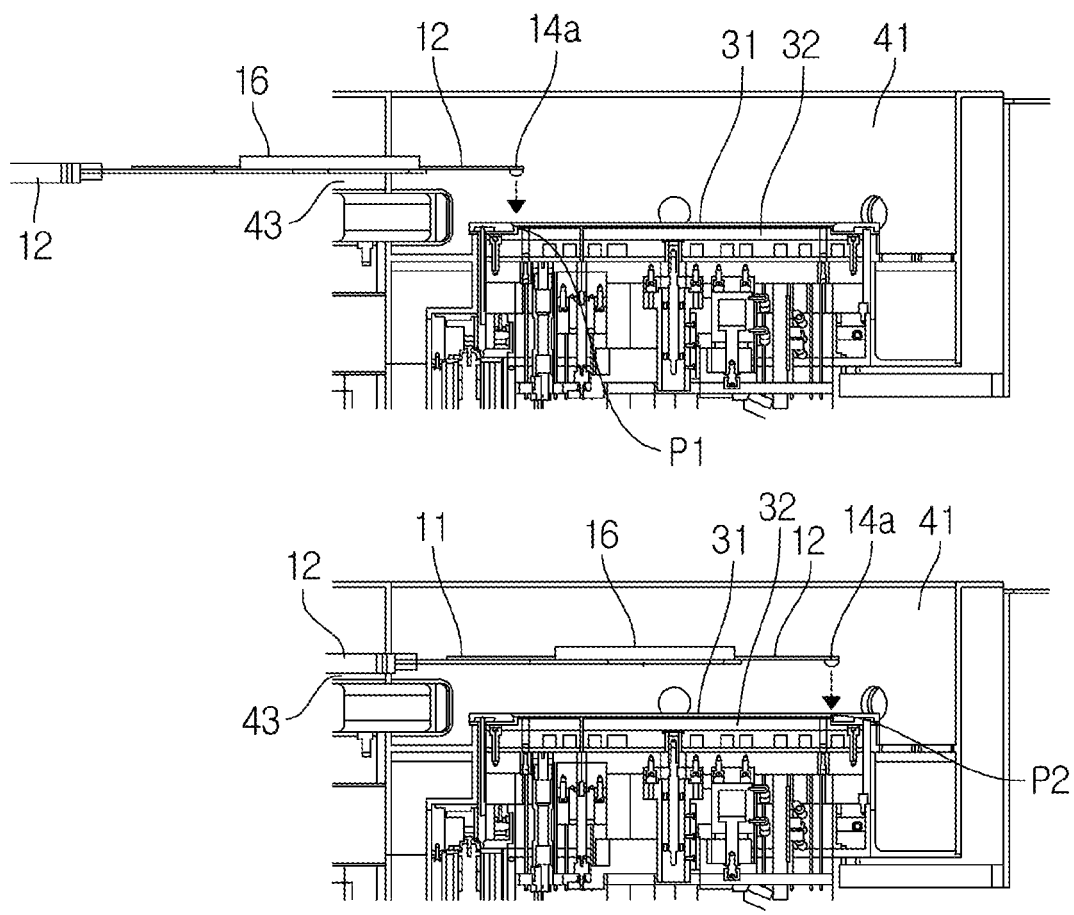

FIGS. 4A and 4B show an exemplary method for monitoring an exchanging process according to the present invention.

Referring to FIGS. 4A and 4B, a method for monitoring an exchanging process of a semiconductor part comprises fixing the part transferred by a robot arm at an exchanging position P41; preparing a part exchanging means having a camera module to transmit an obtained image via a wireless communication P42; moving the part exchanging means to the exchanging position P43; obtaining at least one image of different portions of the fixed part, and transmitting the image via a wireless communication P45; extracting at least one parameter value from the image, and judging whether the value is within a reference range P46; and storing the parameter value P48, wherein the camera module obtains the image through a hole formed at the part exchanging means.

The finger 12 may be moved within the processing chamber 41 through an opening 43 for fixing the exchanging edge ring 32 around the electrostatic chuck 31 where the exchanged edge ring is removed P41. If the exchanging edge ring 32 is fixed around the electrostatic chick 31, then the finger 12 may be moved within the processing chamber 41 again through the opening 43 P43. The image obtaining means 14a such as the camera has been loaded on the hand 12a P42, and the finger is the same as or different from that for fixing the edge ring 32. As the finger 12 enters the processing chamber 41, the image obtaining means 14a may obtain an image for calculating a separation distance between the edge ring 32 and the electrostatic chuck 31 at first position P1. And then the image obtaining means 14a may be moved to a second position P2 different from the first position P1 for obtaining the other image for calculating a second separation distance between the edge ring 32 and the electrostatic chuck 31 to digitize the separation distances at position P1 and position P2. As described above, the processor 13 may be arranged at the finger 14 or any other proper place, and the image obtaining means 14a and the processing 13 may form a wireless transmitting system for transmitting the obtained image to the outside via wireless communication. Images may be obtained at two or more positions to transmit the images to the controlling module displaced at the outside via the wireless transmitting system P45. The controlling module may judge that the digitized data calculated form the transmitted images is within a predetermined range according to a processing step P46. If the digitized data is out of the range NO, then the alarm signal or an error signal may be generated. And the finger may be moved to the processing chamber again for correcting the fixing position of the edge ring 32 P47. Otherwise, if the digitized data is within the range YES, then the digitized data may be stored P48. In the above example, only one image obtaining means 14a is depicted for a convenience of explanation, but a pair of image obtaining means may be installed at a pair of the hands. And also, the position P1, P2 may be determined in various ways. And also, the image obtaining means 14a can detect a condition of the processing chamber 41 as well as the fixed position of the edge ring 32. The image obtaining means 14a may have various functions, but not limited to. And various kinds of parts may be exchanged by the exchanging module.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. An apparatus for monitoring an exchanging process of a semiconductor part, comprising;
   a finger having a pair of hands formed at one end portion thereof and an image obtaining means disposed in each of the hands, the finger being configured to be coupled with a robot arm;
   a loading unit detachably attached on the finger, the loading unit being configured to load the semiconductor part; and
   a processor disposed in the loading unit and wirelessly connected to the image obtaining means, the processor being configured to process an image obtained by the image obtaining means to be a wireless transmittable data and wirelessly transmit the wireless transmittable data to an external controlling unit.

2. The apparatus according to claim 1, wherein the semiconductor part is an edge ring to be coupled around a wafer, and the image includes an image for detecting a separation distance between an electrostatic chuck and the edge ring.

3. The apparatus according to claim 1, wherein the image obtaining means includes: a camera module.

4. The apparatus according to claim 3, wherein the finger includes: a penetrating hole formed in each of the hands, the camera module being disposed over the penetrating hole.

5. The apparatus according to claim 1, wherein the finger includes: a connector connected to the other end portion thereof, the connector being configured to be detachably coupled to the robot arm.

* * * * *